United States Patent
Liu et al.

(10) Patent No.: US 9,136,500 B2
(45) Date of Patent: Sep. 15, 2015

(54) DISPLAY PANEL AND METHOD FOR FABRICATING THE SAME

(71) Applicant: HannStar Display Corporation, New Taipei (TW)

(72) Inventors: Chun-Pin Liu, Taipei (TW);
Ming-Hung Chung, Kaohsiung (TW);
Min-Chuan Wu, Taichung (TW);
Jion-Ting Wu, Tainan (TW)

(73) Assignee: HANNSTAR DISPLAY CORPORATION, New Taipei (TW)

( * ) Notice: Subject to any disclaimer, the term of this patent is extended or adjusted under 35 U.S.C. 154(b) by 0 days.

(21) Appl. No.: 14/198,598

(22) Filed: Mar. 6, 2014

(65) Prior Publication Data
US 2014/0252329 A1 Sep. 11, 2014

(30) Foreign Application Priority Data
Mar. 6, 2013 (CN) .......................... 2013 1 0070607

(51) Int. Cl.
*H01L 51/52* (2006.01)
*H01L 51/56* (2006.01)
*H01L 27/32* (2006.01)

(52) U.S. Cl.
CPC ............ *H01L 51/52* (2013.01); *H01L 51/5275* (2013.01); *H01L 51/56* (2013.01); *H01L 27/323* (2013.01)

(58) Field of Classification Search
CPC ..................... H01L 51/5262; H01L 51/5281
USPC ..................................................... 257/40, 98
See application file for complete search history.

(56) References Cited

U.S. PATENT DOCUMENTS

| 7,942,537 B2* | 5/2011 | Krijn et al. ....................... 362/19 |
| 8,279,371 B2* | 10/2012 | Song et al. ....................... 349/65 |
| 8,759,864 B2* | 6/2014 | Kim et al. ....................... 257/98 |

* cited by examiner

*Primary Examiner* — Mark Prenty
(74) *Attorney, Agent, or Firm* — CKC & Partners Co., Ltd.

(57) ABSTRACT

A display panel and a method for fabricating the same are provided. The display panel includes a substrate, a transparent film, and a light-gathering film. The substrate includes organic light emitting diode (OLED) elements. The transparent film is disposed on the substrate. The light-gathering film is disposed on the transparent film. In the fabrication method of the display panel, a substrate is first provided, in which the substrate includes OLED elements. Then, a transparent film is provided, in which the transparent film has a first surface and a second surface opposite to the first surface. Thereafter, a light-gathering material is coated to form a light-gathering film on the first surface of the transparent film. Then, a sensing layer is disposed on the second surface of the transparent film. Thereafter, the transparent film is disposed on the substrate to sandwich the sensing layer between the transparent film and the substrate.

5 Claims, 12 Drawing Sheets

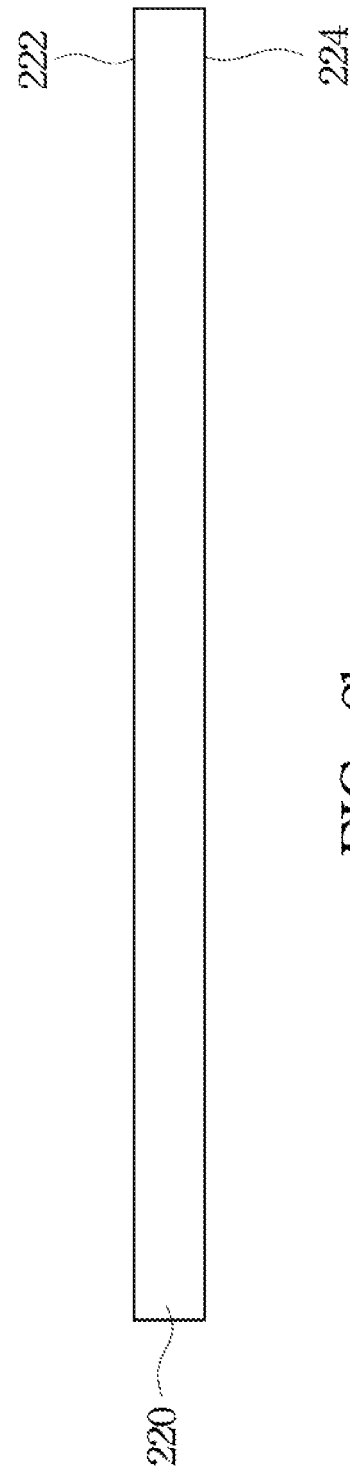
FIG. 2a
FIG. 2b

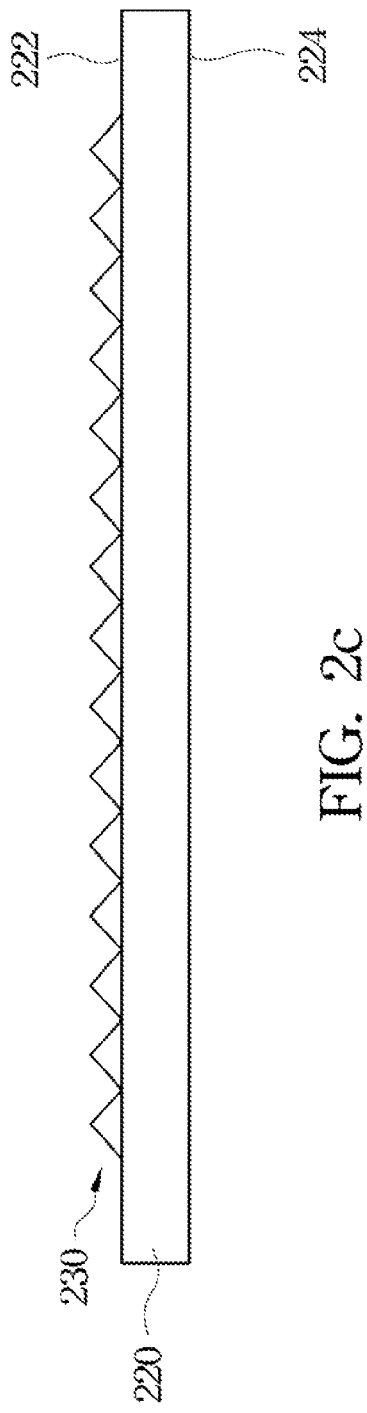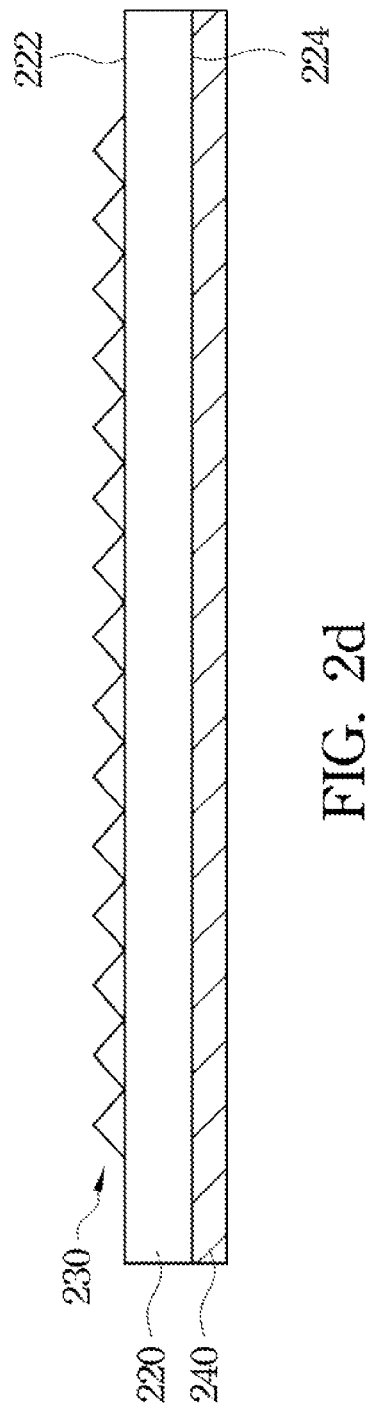

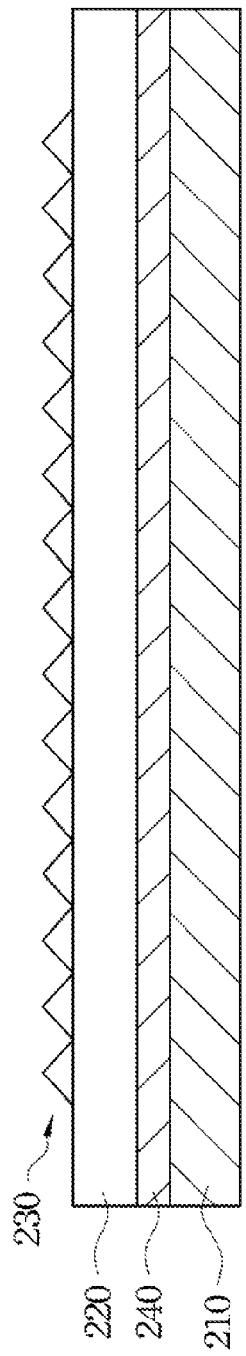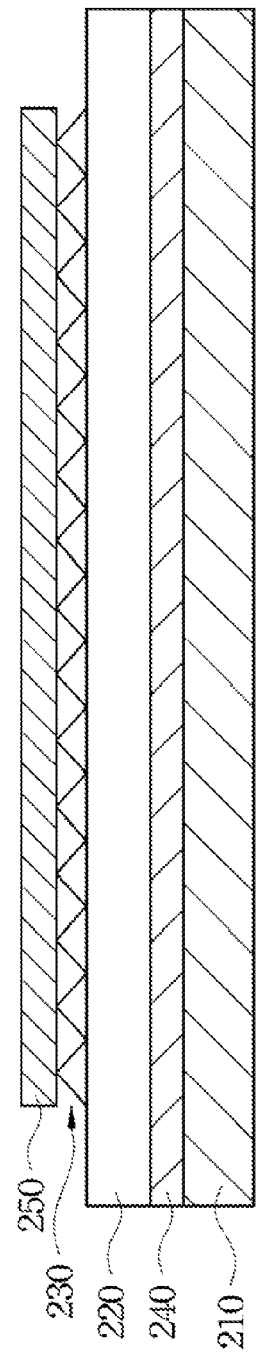

DISPLAY PANEL AND METHOD FOR FABRICATING THE SAME

RELATED APPLICATIONS

This application claims priority to China Application Serial Number 2013100706072, filed Mar. 6, 2013, which is herein incorporated by reference.

BACKGROUND

1. Field of Invention

The present invention relates to a display panel and a method for fabricating the display panel. More particularly, the present invention relates to an organic light-emitting diode (OLED) display panel and a method for fabricating the OLED display panel.

2. Description of Related Art

Electroluminescent (EL) device employing organic luminescent materials exhibit fast response time and wide viewing angles, and thus display industries are devoted to developing techniques related the EL devices. For display apparatuses, when the organic luminescent materials are used as light-emitting materials, the displays may exhibit fast response rates, wide viewing angles without needing to use backlight modules.

When the organic luminescent materials are applied to consumer electronics products, such as digital cameras, personal digital assistants (PDAs) and smart phones, the consumer electronics products may have the advantages of low power consumption, high brightness, and thinness and lightweight design. A representative example using an organic luminescent material is an OLED. In general, an OLED includes a transparent anode, a metal cathode and an organic thin film formed between the transparent anode and the metal cathode. The organic thin film contains a luminescent material which can emit light when an external voltage is applied.

However, an OLED display panel has very high manufacturing cost, and shorter operation life than a general liquid crystal panel. Hence, there is a need to provide a novel display panel and a method for fabricating the display panel to lower the manufacturing cost of the OLED display panel or prolong the operation life of the OLED display panel.

SUMMARY

An aspect of the present invention is to provide a display panel and a method for fabricating the display panel to increase the brightness of a predetermined region by using a light-gathering film, thereby decreasing the working current required by OLED elements or reducing the number of OLED elements required by an OLED display panel, thus increasing operation life of the OLED display panel or decreasing the manufacturing cost of the OLED display panel.

According to an embodiment of the present invention, a display panel includes a substrate, a transparent film and a light-gathering film. The substrate includes OLED elements. The transparent film is disposed on the substrate. The light-gathering film is disposed on the transparent film to converge light emitted by the OLEO elements into a predetermined region.

According to another embodiment of the present invention, a display panel includes a substrate and a brightness-enhancement film. The substrate includes a plurality of OLED elements. The brightness-enhancement film is disposed on the substrate.

According to another embodiment of the present invention, in a method of fabricating a display panel, a substrate is first provided, in which the substrate includes OLED elements. Then, a transparent film is provided, in which the transparent film has a first surface and a second surface opposite to the first surface. Thereafter, a light-gathering material is coated to form a light-gathering film on the first surface of the transparent film. Then, a sensing layer is disposed on the second surface of the transparent film. Thereafter, the transparent film is disposed on the substrate to sandwich the sensing layer between the transparent film and the substrate.

According to another embodiment of the present invention, in a method of fabricating a display panel, a substrate is first provided. The substrate includes OLED elements. Then, a transparent film is provided. Thereafter, a sensing layer is disposed on the transparent film. Then, the transparent film is disposed on the substrate to sandwich the sensing layer between the transparent film and the substrate. Thereafter, a polarizer is provided. Then, a light-gathering material is coated on the polarizer to form a light-gathering film on the polarizer. Thereafter, the polarizer is disposed on the transparent film to sandwich the light-gathering film dispose between the transparent film and polarizer.

It can be known from the above that, the embodiments of the present invention use the light-gathering film disposed on the transparent film or the polarizer used in the OLED display panel to converge light emitted by the OLED elements into a region predetermined by a user, thereby increasing brightness of the OLED display panel. Thus, the OLED display panels of the embodiments of the present invention can obtain a brightness equivalent to that of a known OLED display panel by decreasing the number or the working current of the OLED elements therein.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2a-FIG. 2g are schematic cross-sectional views of intermediate stages showing a method for fabricating a display panel in accordance with an embodiment of the present invention;

DETAILED DESCRIPTION

Figure 1:
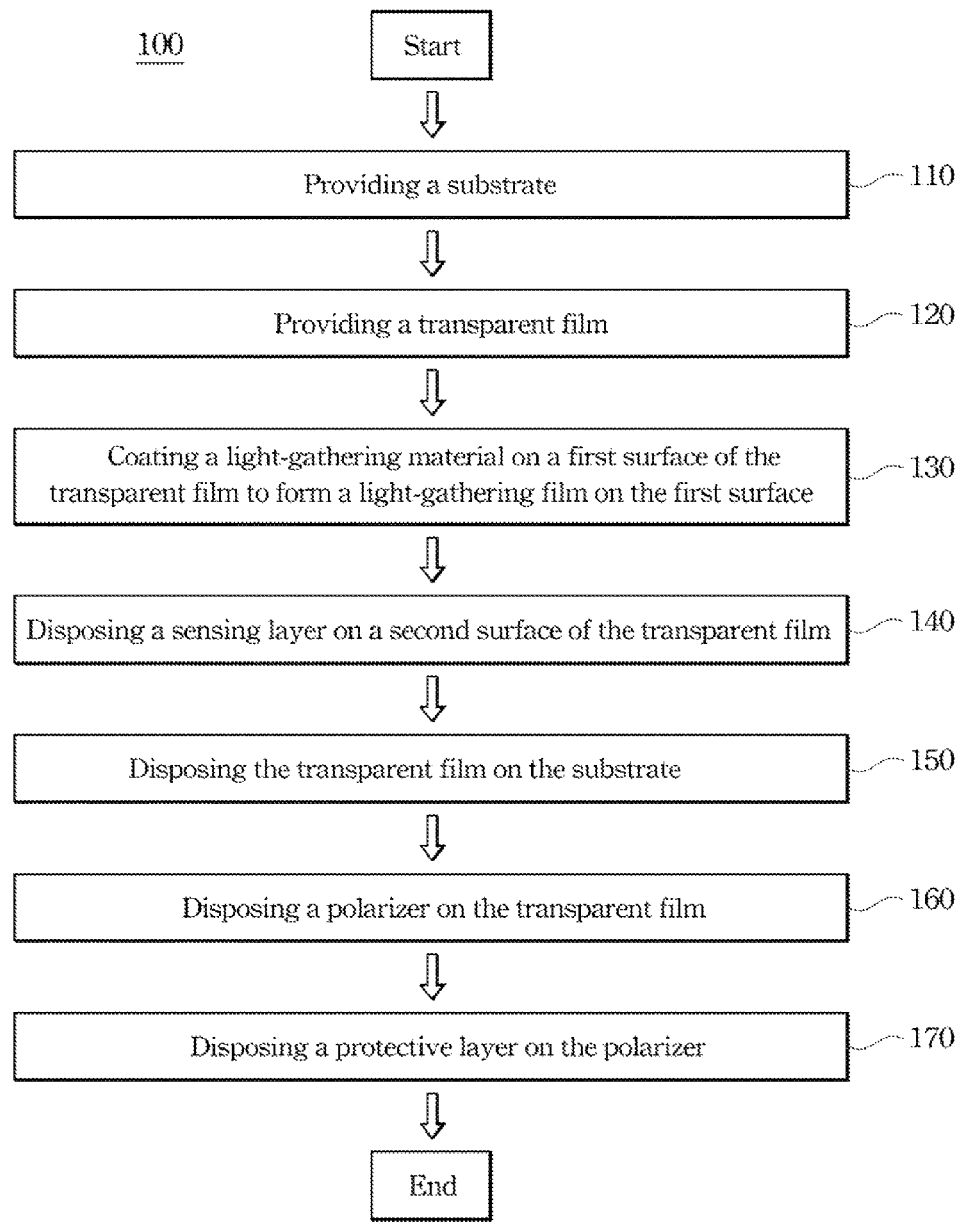
FIG. 1 is a flow chart showing a method for fabricating a display panel in accordance with an embodiment of the present invention.

Referring to FIG. 1 and FIG. 2a-FIG. 2g simultaneously, FIG. 1 is a flow chart showing a method 100 for fabricating a display panel 200 in accordance with an embodiment of the present invention, and FIG. 2a-FIG. 2g are schematic cross-sectional views of intermediate stage showing the method 100 for fabricating the display panel 200 in accordance with an embodiment of the present invention. In the method 100, a substrate-providing step 110 is first performed to provide a substrate 210. As shown in FIG. 3, the substrate 210 includes data lines 212, scan lines 214, switches 216 and organic light emitting diode (OLED) elements 218 for showing image data. The switch 216 may be, for example, a thin-film transistor, but embodiments of the present invention are not limited thereto.

After the substrate-providing step 110 is performed, a film-providing step 120 is performed to provide a transparent film 220, as shown in FIG. 2b. The transparent film 220 has a surface 222 and a surface 224. The surface 222 and the surface 224 are opposite to each other. The transparent film 220 is used for protecting the substrate 210. The material of the transparent film 220 may be transparent material or the like, such as glass or plastic.

After the film-providing step 120 is performed, a light-gathering-film-disposing step 130 is performed to dispose a light-gathering film 230 on the surface 222 of the transparent film 220, as shown in FIG. 2c. In the present embodiment, the light-gathering-film-disposing step 130 coats light-gathering material on the surface 222 of the transparent film 220 for forming the light-gathering film 230. In other embodiments, a brightness-enhancement film is used as the light-gathering film 230 in the light-gathering-film-disposing step 130, and the brightness-enhancement film is adhered to the surface 222 of the transparent film 220. Besides, the light-gathering film 230 of the present embodiment has prisms with pyramid faces, but is not limited thereto. In other embodiments, the light-gathering film 230 has prisms with cylinders.

After the light-gathering-film-disposing step 130 is performed, a sensing-layer-disposing step 140 is performed to dispose a sensing layer 240 on the surface 224 of the transparent film 220, as shown in FIG. 2d. The sensing layer 240 is used to sense a user's motion and send a sensed result to a processor to perform a corresponding operation according to the sensed result. In the present embodiment, the sensing layer 240 includes sensors (not shown), and the sensors may be capacitive sensors, resistive sensors or optical sensors, but embodiments of the present invention are not limited thereto.

After the sensing-layer-disposing step 140 is performed, an assembling step 150 is performed to combine the transparent film 220 with the substrate 210. As shown in FIG. 2e, the sensing layer 240 is disposed between the transparent film 220 and the substrate 210. Thereafter, a polarizer-disposing step 160 is performed to dispose a polarizer 250 on the transparent film 220, as shown in FIG. 2f. In the present embodiment, the polarizer 250 is adhered to the light-gathering film 230 of the transparent film 220 by hydrogel, but embodiments of the present invention are not limited thereto.

Figure 2G:
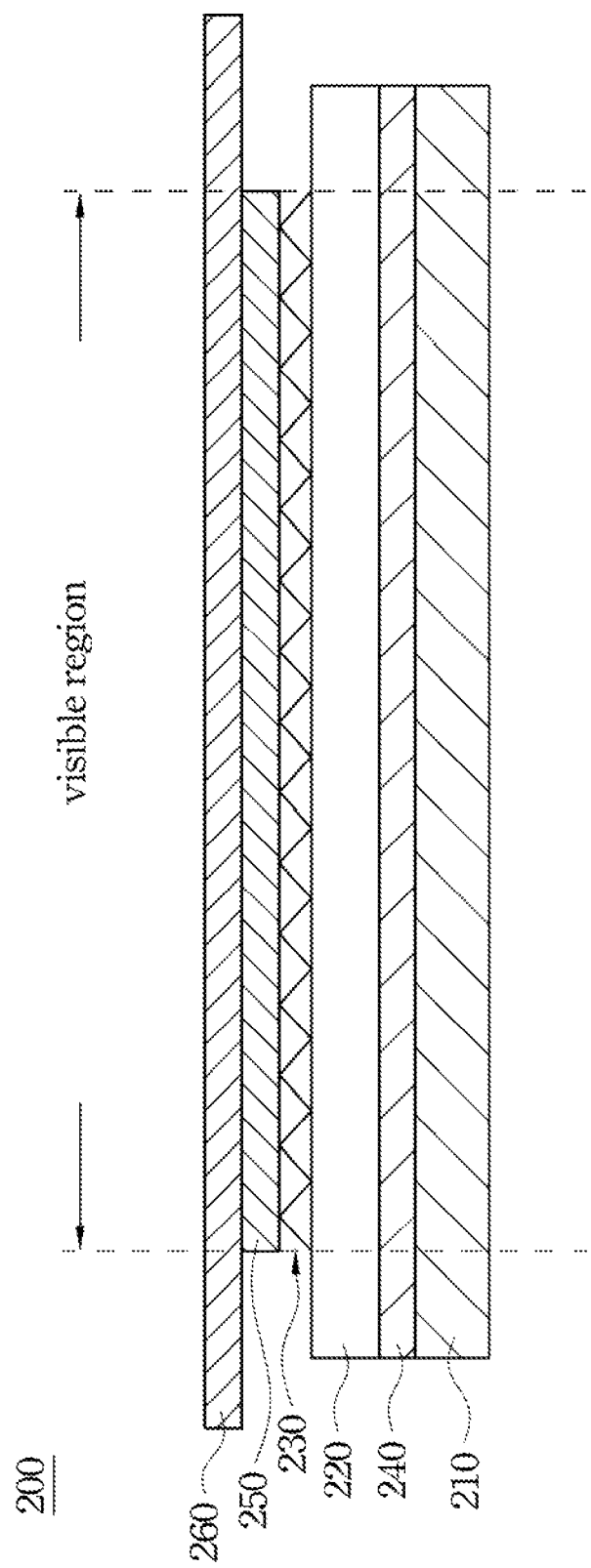
Figure 3:
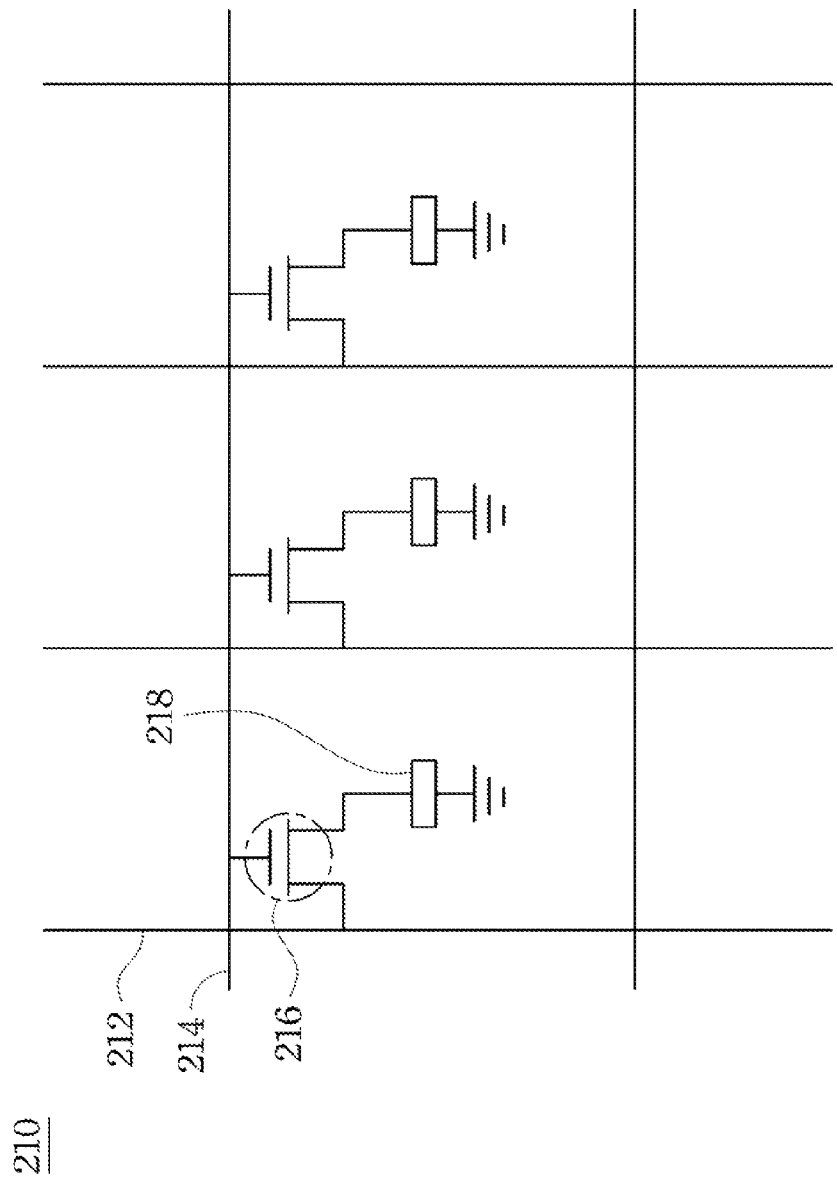
FIG. 3 is a schematic structural diagram showing a circuit structure of a display panel in accordance with various embodiments.

After the polarizer-disposing step 160 is performed, a protective-layer-disposing step 170 is performed to dispose a protective layer 260 on the polarizer 250, as shown in FIG. 2g. The protective layer 260 is used to protect the display panel 200. The material of the protective layer 260 may be acrylic or plastics, but embodiments of the present invention are not limited thereto.

It can be known from the above that, the display panel 200 of the present embodiment has the light-gathering film 230. The light-gathering film 230 can converge light emitted by the OLED elements 218 into a region predetermined by a user appropriately, for example, to a central portion of a visible region, thus raising brightness of the central portion of the visible region. Because a general smart phone only requires the brightness on its central portion to meet a specific standard, the light-gathering film 230 used to converge light to the central portion of the visible region may improve specifications of the display panel 200. Manufacturers of the display panel 200 can lower the working current of the OLED elements or reduce the number of the OLED elements required by an OLED display panel, thus increasing the operation life of the OLED display panel and decreasing the manufacturing cost of the OLED display panel.

Figure 4:
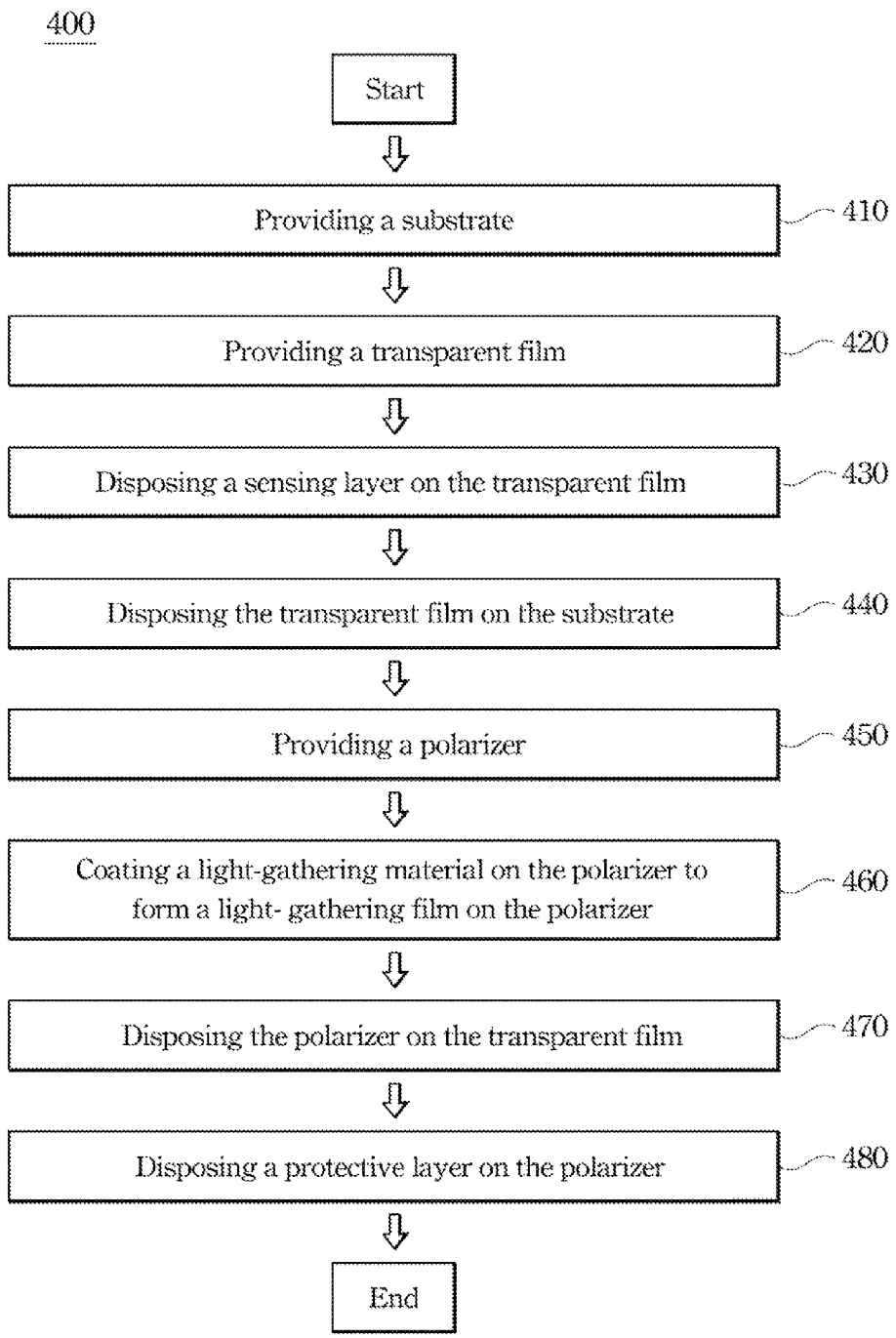
FIG. 4 is a flow chart showing a method for fabricating a display panel in accordance with another embodiment of the present invention.

Referring to FIG. 4 and FIG. 5a-FIG. 5h simultaneously, FIG. 4 is a flow chart showing a method 400 for fabricating a display panel in accordance with another embodiment of the present invention, and FIG. 5a-FIG. 5h are schematic cross-sectional views of intermediate stage showing the method 400 for fabricating the display panel in accordance with another embodiment of the present invention. The method 400 is also used to fabricate the display panel 200, but have slightly different steps.

Figure 5A:
FIG. 5a-FIG. 5h are schematic cross-sectional views of intermediate stage showing a method for fabricating a display panel in accordance with another embodiment of the present invention.
Figure 5B:
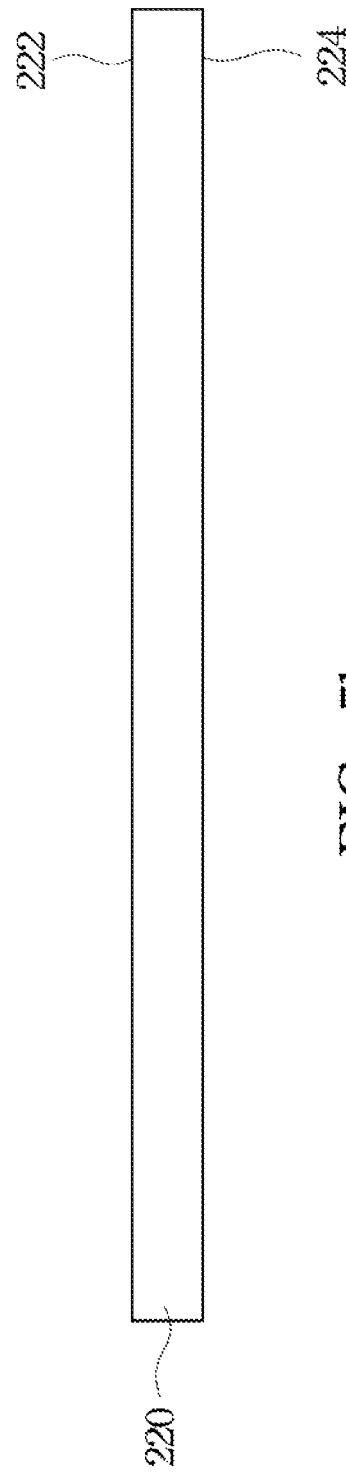

In the method 400, a substrate-providing step 410 is first performed to provide the substrate 210, as shown in FIG. 5a. Thereafter, a film-providing step 420 is performed to provide the transparent film 220, as shown in FIG. 5b.

Figure 5C:
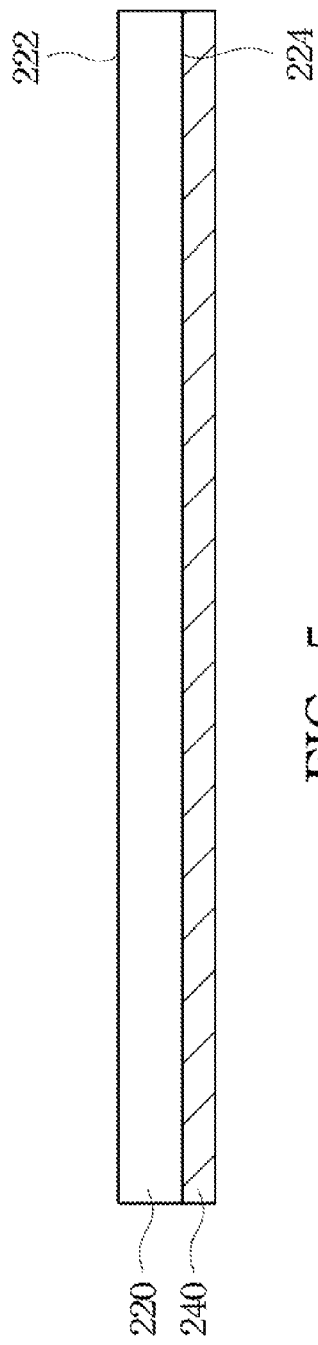
Figure 5D:
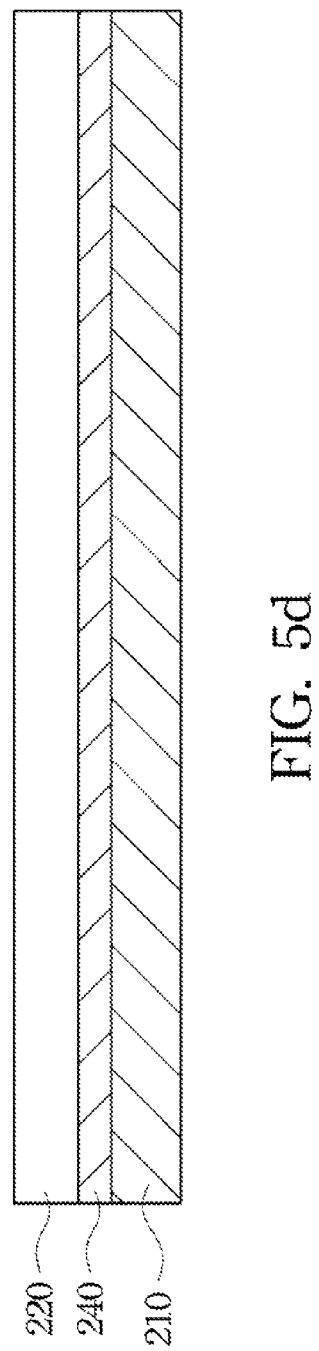
Figure 5E:
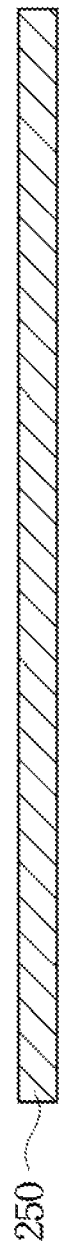
Figure 5F:

Thereafter, a sensing-layer-disposing step 430 is performed to dispose the sensing layer 240 on the surface 224 of the transparent film 220, as shown in FIG. 5c. Thereafter, an assembling step 440 is performed to dispose the transparent film 220 on the substrate 210, as shown in FIG. 5d. The sensing layer 240 is disposed between the transparent film 220 and the substrate 210. Thereafter, a polarizer-providing step 450 is performed to provide the polarizer 250, as shown in FIG. 5e. Thereafter, a light-gathering-film-disposing step 460 is performed to dispose the light-gathering film 230 on a surface of the polarizer 250, as shown in FIG. 5f. In the present embodiment, the light-gathering-film-disposing step 460 coats the light-gathering material on the surface of the polarizer 250 for forming the light-gathering film 230. In other embodiments, a brightness-enhancement film is used as the light-gathering film 230 in the light-gathering-film-disposing step 460, and the brightness-enhancement film is adhered to the surface of the polarizer 250.

Figure 5G:
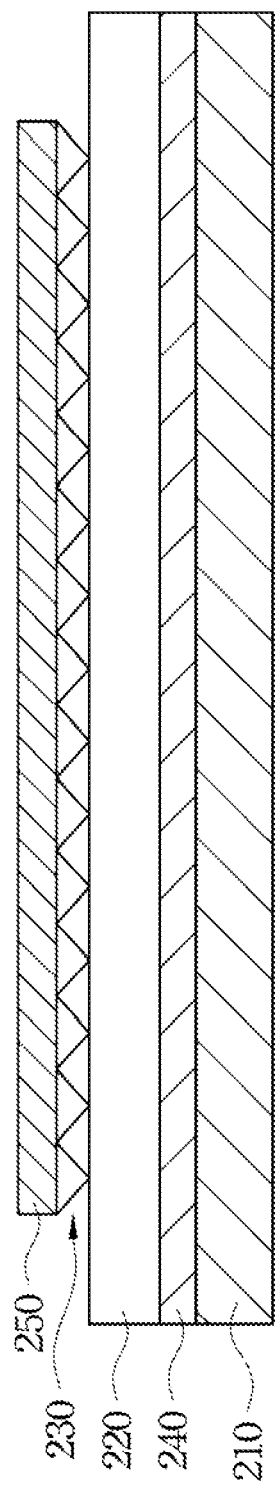
Figure 5H:
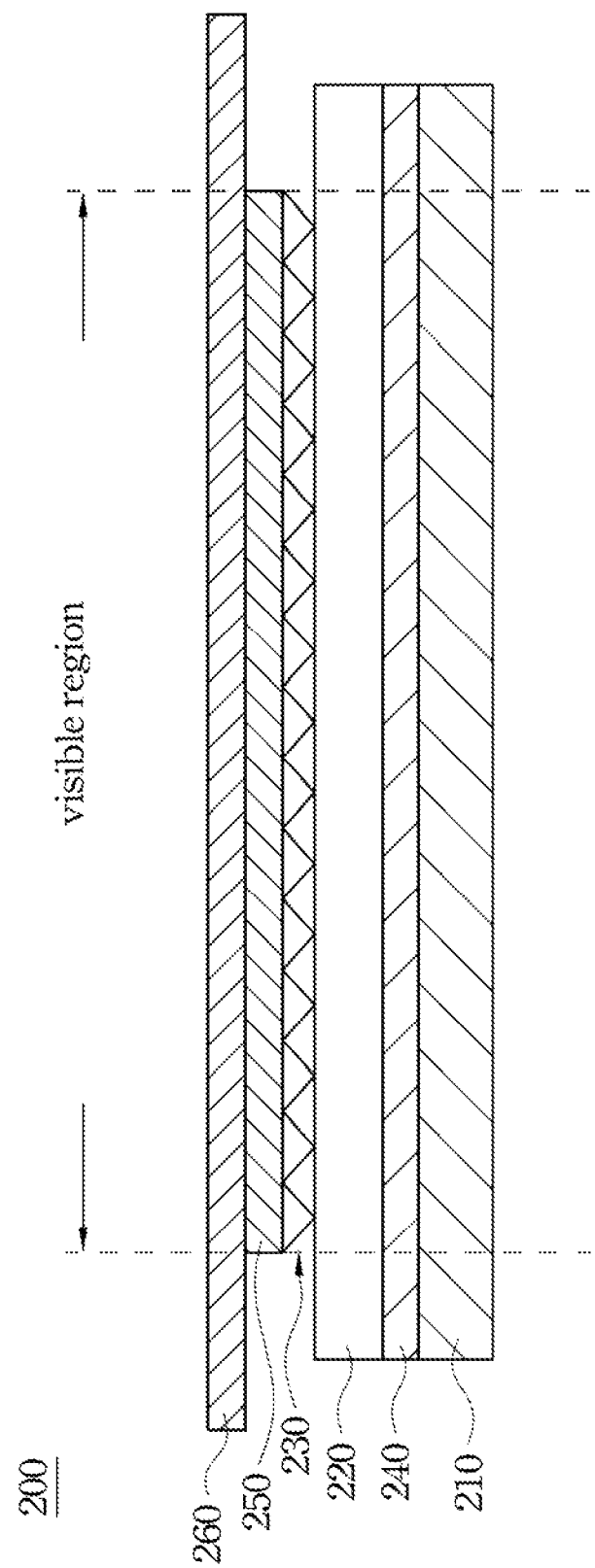

Thereafter, an assembling step 470 is performed to dispose the polarizer 250 on the transparent film 220, as shown in FIG. 5g. The light-gathering film 230 is disposed between the polarizer 250 and the transparent film 220. Thereafter, a protective-layer-disposing step 480 is performed to dispose the protective layer 260 on the polarizer 250, as shown in FIG. 5h.

It can be known from the above that, the method 400 in the present embodiment is similar to the method 100, but is different in that the light-gathering material in the method 400 is coated on the polarizer 250 rather than on the transparent film 220.

It is noted that the aforementioned methods 100 and 400 are merely some embodiments of the present invention, and the present invention may also have other variations of embodiments. In other embodiments, the aforementioned steps may be skipped or additional steps may be added. Unless otherwise expressly defined, the steps described in the methods 100 and 400 may be varied in a logical and coherent condition.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel, comprising:
    a substrate comprising a plurality of organic light emitting diode (OLED) elements;
    a transparent film disposed on the substrate;
    a light-gathering film disposed on the transparent film to converge light emitted by the OLED elements into a predetermined region; and
    a sensing layer disposed on the substrate, wherein the sensing layer is disposed between the transparent film and the substrate;
    wherein the light-gathering film has a plurality of cylinder structures to converge the light emitted by the OLED elements.

2. The display panel of claim 1, wherein the light-gathering film is disposed on a first surface of the transparent film, and the sensing layer is disposed on a second surface of the transparent film, wherein the first surface is opposite to the second surface.

3. The display panel of claim 1, further comprising:
    a polarizer disposed on the transparent film, wherein the light-gathering film is disposed between the polarizer and the transparent film.

4. The display panel of claim 3, further comprising:
    a protective layer disposed on the polarizer.

5. The display panel of claim 1, wherein the substrate further comprises a plurality of switches, a plurality of data lines and a plurality of scan lines.

* * * * *